United States Patent [19]

Ventura

[11] Patent Number: 4,609,235
[45] Date of Patent: Sep. 2, 1986

[54] DRAWER FOR ELECTRICAL CABINETS
[75] Inventor: Luciano Ventura, Zola Predosa, Italy
[73] Assignee: Finike Italiana Marposs S.p.A., S. Marino di Bentivoglio, Italy
[21] Appl. No.: 707,557
[22] Filed: Mar. 4, 1985
[30] Foreign Application Priority Data
Mar. 23, 1984 [IT] Italy .................................. 3395 A/84
[51] Int. Cl.⁴ ............................................. A47B 88/00
[52] U.S. Cl. .................. 312/330 R; 220/3.8; 312/223; 312/319; 312/320
[58] Field of Search ............... 312/330 R, 257 A, 319, 312/223, 320; 40/611, 618, 620; 361/359; 220/3.3, 3.7, 3.8; 49/464

[56] References Cited
U.S. PATENT DOCUMENTS

| | | | |
|---|---|---|---|
| 3,777,224 | 12/1972 | Meacham | 361/357 |
| 3,831,064 | 8/1974 | Keller | 317/101 |
| 3,852,514 | 12/1974 | Lauben | 220/3.8 X |
| 3,918,187 | 11/1975 | Vogele | 40/611 |
| 4,153,313 | 5/1979 | Propst | 312/257 A |
| 4,277,121 | 7/1981 | Possati et al. | 312/320 |
| 4,365,723 | 12/1982 | Palermo | 220/3.8 |
| 4,507,526 | 3/1985 | Thoma | 361/357 |

FOREIGN PATENT DOCUMENTS

| | | |
|---|---|---|
| 2143995 | 3/1972 | Fed. Rep. of Germany . |
| 2846283 | 5/1980 | Fed. Rep. of Germany . |
| 2225916 | 11/1974 | France . |
| 2445091 | 7/1980 | France . |
| 1305483 | 1/1973 | United Kingdom . |

Primary Examiner—James T. McCall
Attorney, Agent, or Firm—Stevens, Davis, Miller & Mosher

[57] ABSTRACT

A drawer for electrical cabinets comprises a frame and a front wall coupled to the frame and including at least one removable panel. In order to provide a modular, cheap and easily assemblable structure, the front wall supports elongated resilient coupling elements and the panel or panels have stop surfaces that can be coupled to the resilient coupling elements through a snap action by applying a front thrust to the panel, from the outside of the drawer.

13 Claims, 5 Drawing Figures

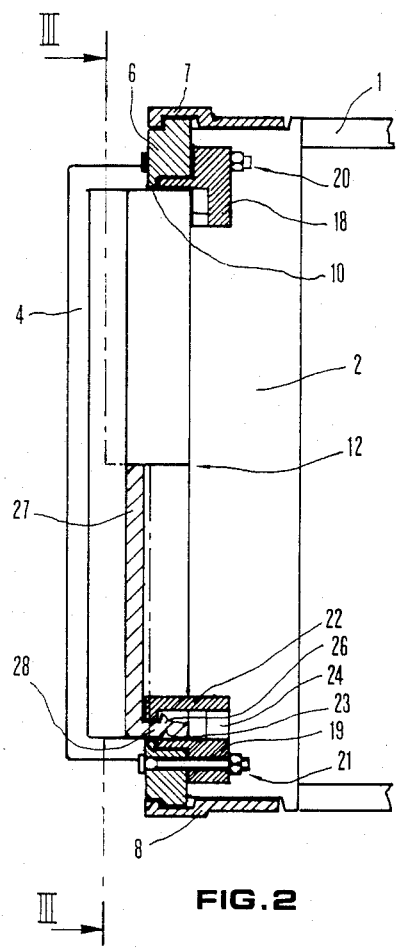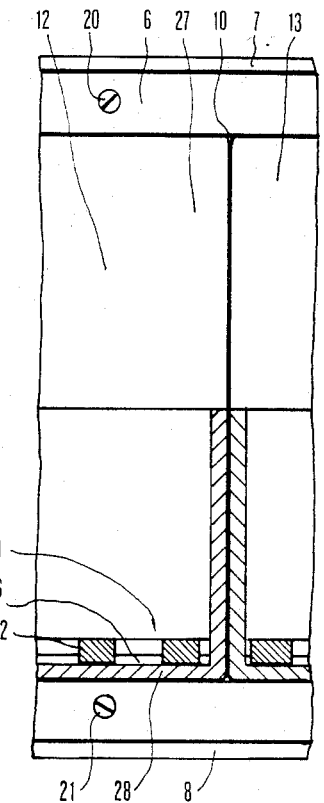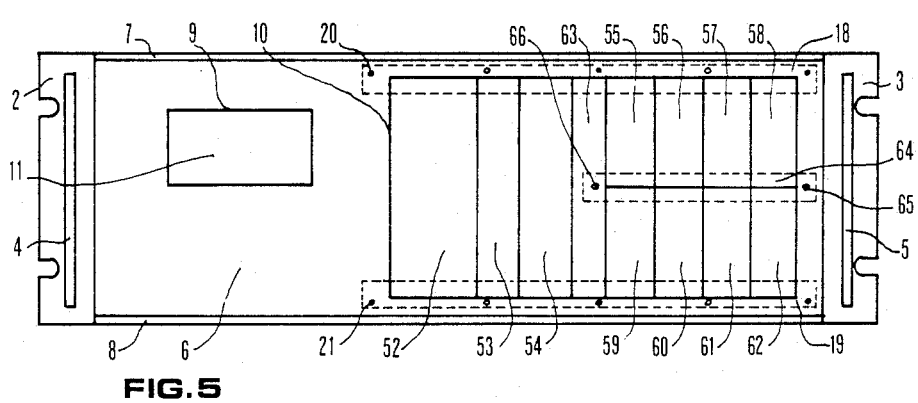
FIG. 2
FIG. 3
FIG. 5

DRAWER FOR ELECTRICAL CABINETS

BACKGROUND OF THE INVENTION

1. Field of the Invention

The invention relates to a drawer for electrical cabinets, comprising a frame and a front wall coupled to the frame, the front wall including first coupling means and at least one panel defining second coupling means for removably coupling the panel to the first coupling means.

2. Description of the Prior Art

Generally, an electrical cabinet comprises one or more drawers, each of which can house various electrical circuits consisting, for example, of printed circuit boards.

The drawers basically comprise a frame and, at the front portion, are closed by one or more panels, that may have the function of supports for electrical circuits and components or of closure only, and that are part of the front wall of the drawer.

Usually, the front wall of each drawer comprises a plurality of panels depending on the number of functions performed by the electrical circuits housed within the drawer, and for different types or variants of drawers, the shape and arrangement of the panels forming their front walls, generally change.

Drawers in which the panels are joined to the frame through threaded couplings are known. This solution allows the use of cheap means, i.e. screws, but requires long assembling operations because every panel is provided with its own screws for coupling to the frame. It is understood that these operations also involve the use of tools.

In other known drawers, such as that described in British Pat. No. 1,305,483, the panels are placed side by side along the front wall of the drawer, into contact with elements secured to the frame, the position and the coupling being defined by slidable latch members as well as by the mutual contact between the panels.

For this drawer, the fastening of each panel does not appear sufficiently safe and stable and, moreover, the coupling operations, although not requiring threaded couplings and use of tools, must be carried out by acting on both the faces of the front wall, for example in order to lock the panels to the rear portion of the wall.

SUMMARY OF THE INVENTION

The present invention has as its object the provision of a system for assembling the front wall of a drawer that is not affected by the above mentioned drawbacks.

According to the present invention, a drawer for electrical cabinets comprises a frame and a front wall adapted to be coupled to the frame, the front wall including at least one panel and coupling means for removably coupling said at least one panel to the frame, the coupling means including resilient elements and stop means adapted to be mutually coupled through a snap action by applying a front thrust to the panel.

The invention provides drawers for electrical cabinets that, starting from basic arrangements equal for different solutions, may by assembled in a simple, quick and safe way.

By the present invention the operations for assembling the front wall of a drawer may be performed through a simple positioning and a manual thrust applied to the panel or panels, by acting from one side only of the drawer and without any need of tools.

The invention offers the possibility of obtaining different arrangements of the front wall of a drawer for electrical cabinets by using the same coupling means, the reliability and stability of the coupling of the panel or of each panel being independent from the particular arrangement. One additional advantage consists in the possibility of using panels having different dimensions, also depending on the arrangement of the coupling means fixed with respect to the frame.

BRIEF DESCRIPTION OF THE DRAWINGS

Embodiments of drawers according to the present invention are shown, as an example only, in the annexed drawings, wherein:

FIG. 2 is a section of the drawer of FIG. 1, on an enlarged scale, along path II—II of FIG. 1;

FIG. 3 is a partial section of the drawer of FIGS. 1 and 2, along path III—III of FIG. 2;

FIG. 5 is a front elevation of a drawer for electrical cabinets, according to another embodiment of the invention.

DESCRIPTION OF THE PREFERRED EMBODIMENTS

Figure 1:
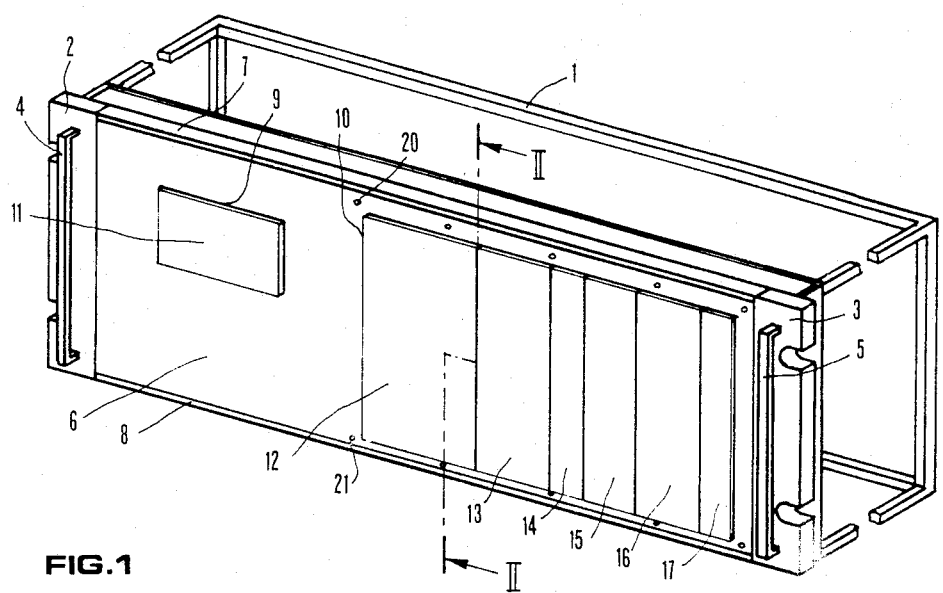
FIG. 1 is a perspective view of a drawer for electrical cabinets, according to a preferred embodiment of the invention.

With reference to FIGS. 1, 2 and 3, a drawer for electrical cabinets comprises a frame including a frame structure 1, to which are fixedly coupled two elements or handle blocks 2, 3, that in their turn comprise handles 4 and 5. The front wall of the drawer comprises a main panel 6, removably secured to handle blocks 2 and 3 by elements 7 and 8, as known from U.S. Pat. No. 4,277,121.

Main panel 6 defines two substantially rectangular openings 9 and 10, the first of which, 9, houses an instrument that in FIG. 1 is schematized and indicated by reference numeral 11.

Additional panels 12, 13, 14, 15, 16 and 17, of different widths, are arranged side by side within opening 10 so as to close the same opening, and thus the front wall.

Figure 4:
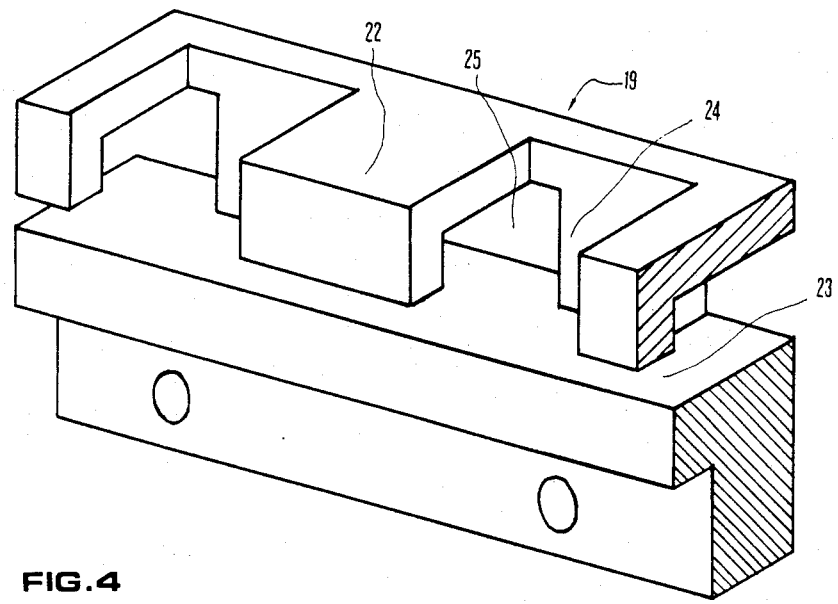
FIG. 4 is a perspective view of a portion of a coupling element, enlarged with respect to FIGS. 2 and 3.

The coupling between main panel 6 and the additional panels 12-17 is obtained through coupling means, that are better visible in FIGS. 2, 3 and 4, with abutment and stop means. In particular, panels 12-17 are secured to first coupling means including resilient coupling elements 18 and 19, that have substantially elongated shape and are fastened to main panel 6 along parallel directions, by means of threaded couplings 20 and 21.

Elements 18 and 19 are made of plastic (thermoplastic) material and—as it is visible in FIG. 4, that shows a considerably enlarged section of element 19—have a special shape.

L-shaped elements 22 defining grip surfaces are resiliently connected to a base 23 by resilient connecting elements 24 separated by openings 25. The bases 23 of elements 18 and 19 are secured to main panel 10, next to the upper and lower sides of opening 10, through threaded couplings 20 and 21.

Panels 12-17 are locked between elements 22 and bases 23, in particular second coupling means including suitable stop surfaces 26 defined by the panels (FIG. 2), due to their special shape and the resilient actions among the various portions of element 19, permit locking of panels 12-17.

The shape of panels 12-17, in particular of panel 12, is better visible in FIGS. 2 and 3.

Panel 12 comprises a substantially flat rectangular face 27 and a bent flange 28 extending along the whole perimeter of face 27, substantially perpendicularly to the latter. The upper and lower edges of flange 28 are shaped so as to define the previously mentioned stop surfaces 26, that are adapted to engage resilient coupling elements 18 and 19, or —more particularly—the grip surfaces or portions of the L-shaped elements 22, that are accessible through opening 10.

Accordingly, the operation for assembling panels 12-17 onto main panel 6 is performed by applying to panels 12-17 a simple front thrust, that causes resilient snap interlocking between upper and lower surfaces 26 and resilient elements 18 and 19.

Therefore, it is evident that the assembling operations, i.e. the operations for fitting up the front wall of a drawer for electrical cabinets, are simple and quick, without any need of using tools and of providing access to internal parts, because the coupling can be controlled from the outside.

Moreover, there is clearly the possibility of obtaining different arrangements of the front wall by using the same main panel 6 and additional panels 12-17 of different widths to be inserted side by side within the opening 10 defined by main panel 6, the coupling being obtained through the same resilient coupling elements 18, 19.

Moreover, it is seen that the various panels 12-17 are locked to resilient coupling elements 18, 19 independently from one another and therefore the possible temporary removal of a panel does not affect the safe locking of the other panels.

FIG. 5 shows an additional possibility offered by the present invention.

Additional panels differing from one another for both width and height are coupled to main panel 6—e.g. the same main panel shown in FIG. 1—, so as to close the opening 10 defined by the main panel 6.

In particular, in addition to rectangular panels 52, 53, 54, having the same height as that of panels 12-17 of FIG. 1, there are rectangular panels 55-62 with reduced height, i.e. half height, that can be arranged along two rows.

Panels 55-62 are assembled by means of elements 18 and 19 as previously described, and through a further elongated resilient coupling element 64 fixed, parallel to elements 18 and 19 and at the same distance from them, to main panel 6 and to a support panel 63, through threaded couplings 65 and 66. Panel 63, having the same width as panels 52, 53, 54, is coupled to main panel 6 in the same way as panels 52-54, but has only the function of support for element 64.

The shape of element 64 is substantially that obtained by joining two specular elements like element 19, with their bases 23 into mutual contact.

In this way, the upper side of element 64 cooperates with stop surfaces defined by panels 55-58 and the lower side with stop surfaces defined by panels 59-62.

Therefore, it is seen that, through the provision of a support panel and the suitable arrangement of an additional resilient coupling element, is also possible to assemble the front wall of a drawer by using panels of different heights, and utilizing again the same main panel.

Of course, it is also possible to arrange the additional panels, or some of them, along more than two rows, by providing a plurality of additional resilient coupling elements.

The present invention may also be applied in a drawer having only one panel. In this case the elements 7 and 8 can be eliminated and two resilient coupling elements can be directly fixed to handle blocks 2, 3 or to rods fastened to handle blocks 2, 3.

It will be understood that the specification and examples are illustrative but not limitative of the present invention and that other embodiments and changes are possible without departing from the scope of the invention.

What is claimed is:

1. A drawer for electrical cabinets, comprising: a frame; a front wall adapted to be coupled to the frame, the front wall comprising a plurality of panels including a main panel fixed to the frame and defining an opening and at least one additional panel adapted to be arranged in said opening; and coupling means fixed to the main panel and to said at least one additional panel for removably coupling said at least one additional panel to the main panel, the coupling means including resilient elements and stop means adapted to be mutually coupled through a snap action by applying a front thrust to the additional panel.

2. The drawer according to claim 1, wherein said resilient elements are, at least partially, fixed to the main panel and the stop means are, at least partially, fixed to said at least one additional panel for removably coupling the additional panel to the main panel.

3. The drawer according to claim 1, comprising a plurality of additional panels adapted to close said opening, wherein the resilient elements are, at least partially, fixed to the main panel and the stop means are, at least partially, fixed to said additional panels for removably and separately coupling the additional panels to the main panel.

4. The drawer as claimed in claim 2, wherein said resilient elements comprise two elongated parallel elements fixed to the main panel and defining grip surfaces accessible through said opening and said stop means comprise at least two stop elements arranged at opposite edges of the additional panel.

5. The drawer as claimed in claim 4, wherein said at least one additional panel has a substantially flat face and at least two bent edges defining said stop elements.

6. The drawer as claimed in claim 2, wherein said resilient elements comprise two elongated parallel elements having relevant bases fixed to the main panel and grip portions resiliently connected to said bases and adapted to lock said stop means, the stop means including at least two stop elements connected to said at least one additional panel.

7. The drawer as claimed in claim 1, wherein the front wall comprises and a plurality of additional panels adapted to be arranged in said opening and wherein the resilient elements comprise two elongated parallel elements having relevant bases connected to the main panel and grip portions resiliently joined to the bases for locking relevant stop means joined to the additional panels.

8. A drawer for electrical cabinets, comprising: a frame; a front wall adapted to be coupled to the frame, the front wall comprising a main panel fixed to the frame and defining an opening, and a plurality of additional panels adapted to be arranged in said opening;

and coupling means for removably coupling said plurality of additional panels to the main panel, the coupling means including resilient elements and stop means adapted to be mutually coupled through a snap action by applying a front thrust to the additional panels, the resilient elements comprising two elongated parallel elements made of plastic material and having relevant bases, connected to the main panel through threaded couplings, and grip portions resiliently joined to the bases for locking relevant stop means joined to the additional panels.

9. A drawer for electrical cabinets, comprising: a frame; a front wall adapted to be coupled to the frame, the front wall comprising a main panel fixed to the frame and defining an opening, and a plurality of additional panels adapted to be arranged in said opening; and coupling means for removably coupling said plurality of additional panels to the main panel, the coupling means including resilient elements and stop means adapted to be mutually coupled through a snap action by applying a front thrust to the additional panels, the resilient elements comprising two elongated parallel elements having relevant bases connected to the main panel and grip portions resiliently jointed to the bases for locking relevant stop means joined to the additional panels, wherein said resilient elements comprise a third elongated element fixed to the main panel and arranged parallel to and between said two elongated parallel elements for coupling at least two of said additional panels along two rows.

10. The drawer as claimed in claim 9, wherein said additional panels comprise at least one support panel coupled to said two elongated parallel elements for supporting the third elongated element.

11. A drawer for electrical cabinets comprising a frame and a front wall adapted to be coupled to the frame, the front wall comprising a substantially rectangular main panel removably fixed to the frame and defining a substantially rectangular opening, and a plurality of substantially rectangular additional panels adapted to close said opening, each of the additional panels having a flat face and a peripheral bent flange defining at its upper and lower edges at least two stop elements, the drawer further comprising two elongated parallel elements having bases fastened to the main panel next to upper and lower sides of said opening and substantially L-shaped grip portions resiliently joined to the bases for locking said stop elements, whereby the additional panels can be separately and removably locked to the main panel by applying a front thrust to the relevant additional panel.

12. A drawer for electrical cabinets comprising:
a frame;
a main panel removably fixed to the frame, the main panel defining a front surface, a rear surface and a substantially rectangular opening;
a plurality of additional panels adapted to close said opening; and
locking means for removably and separately locking the additional panels to the main panel, the locking means including: coupling means fixed to the rear surface of the main panel next to upper and lower sides of said opening, the coupling means including resilient grip elements protruding in said opening; and stop elements joined to the additional panels and adapted to engage said resilient grip elements through a snap action, whereby the additional panels can be locked to the main panel by applying a front thrust to the relevant additional panel.

13. A drawer for electrical cabinets, comprising:
a frame;
a main panel removably fixed to the frame, the main panel defining a substantially rectangular opening;
a plurality of additional panels adapted to close said opening; and
locking means for removably and separately locking the additional panels to the main panel, the locking means comprising stop elements joined to the additional panels and coupling means including two elongated parallel resilient elements, each having a base fixed to the main panel next to upper and lower sides of said opening and substantially L-shaped portions defining resilient grip elements; the stop elements being adapted to engage said resilient grip elements through a snap action, whereby the additional panels can be locked to the main panel by applying a front thrust to the relevant additional panel; wherein the coupling means further include a third elongated resilient element, the third elongated resilient element being coupled to the main panel, arranged between and parallel to said two elongated resilient elements, and defining a plurality of pairs of L-shaped portions defining relevant grip elements; and wherein the additional panels can be arranged along two rows, the panels of the two rows being coupled respectively to the third elongated resilient element and to a relevant one of said two elongated parallel resilient elements.

* * * * *

UNITED STATES PATENT AND TRADEMARK OFFICE
CERTIFICATE OF CORRECTION

PATENT NO. : 4,609,235

DATED : September 2, 1986

INVENTOR(S) : Luciano VENTURA

It is certified that error appears in the above-identified patent and that said Letters Patent is hereby corrected as shown below:

Column 4, line 57, "and" should be cancelled.

Signed and Sealed this

Tenth Day of March, 1987

*Attest:*

DONALD J. QUIGG

*Attesting Officer*  Commissioner of Patents and Trademarks